(12) United States Patent
Katsumata et al.

(10) Patent No.: US 10,964,865 B2
(45) Date of Patent: Mar. 30, 2021

(54) PRINTED BOARD, LIGHT EMITTING DEVICE, AND METHOD FOR MANUFACTURING SAME

(71) Applicant: NICHIA CORPORATION, Anan (JP)

(72) Inventors: Masaaki Katsumata, Anan (JP); Masakazu Sakamoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 15/719,564

(22) Filed: Sep. 29, 2017

(65) Prior Publication Data

US 2018/0097164 A1  Apr. 5, 2018

(30) Foreign Application Priority Data

Sep. 30, 2016 (JP) .............................. JP2016-192933

(51) Int. Cl.
*H01L 33/62* (2010.01)
*B23K 26/082* (2014.01)
(Continued)

(52) U.S. Cl.
CPC ............ *H01L 33/62* (2013.01); *B23K 26/082* (2015.10); *H01L 21/4803* (2013.01); *H01L 21/4853* (2013.01); *H01L 23/49805* (2013.01); *H05K 3/0038* (2013.01); *H05K 3/403* (2013.01); *B23K 26/382* (2015.10); *H01L 33/52* (2013.01);
(Continued)

(58) Field of Classification Search
CPC .................................................. H01L 21/4853
See application file for complete search history.

(56) References Cited

U.S. PATENT DOCUMENTS 4,791,248 A  12/1988 Oldenettel
4,921,054 A  5/1990 Voss et al.
(Continued)

FOREIGN PATENT DOCUMENTS

JP  09-321432  12/1997
JP  2001-094007  4/2001
(Continued)

OTHER PUBLICATIONS

Office Action with Form PTO-892 Notice of References Cited issued by the U.S. Patent and Trademark Office for the co-pending U.S. Appl. No. 16/744,175, dated Oct. 26, 2020.
(Continued)

*Primary Examiner* — Eugene Lee
(74) *Attorney, Agent, or Firm* — Mori & Ward, LLP

(57) ABSTRACT

A method for manufacturing a printed board includes steps of; providing a starting board comprising a base member having a plate-like shape, having an upper surface and a lower surface opposite the upper surface, and having an insulation property, a first metal layer disposed on the upper surface, and a second metal layer disposed on the lower surface; and laser machining a through-hole penetrating the starting board in a thickness direction of the starting board by irradiating a laser beam irradiation area of the starting board with a laser beam from a side of the starting board on which side the first metal layer is disposed. The method further includes a step of etching the second metal layer so as to remove a portion of the second metal layer located in the laser beam irradiation area, prior to the step of laser machining.

26 Claims, 12 Drawing Sheets

(51) Int. Cl.
  *H01L 21/48* (2006.01)
  *H01L 23/498* (2006.01)
  *H05K 3/00* (2006.01)
  *H05K 3/40* (2006.01)
  *H01L 33/52* (2010.01)
  *B23K 26/382* (2014.01)
  *H05K 1/18* (2006.01)
  *H05K 3/42* (2006.01)

(52) U.S. Cl.
  CPC  *H01L 2224/16225* (2013.01); *H01L 2224/97* (2013.01); *H01L 2933/0033* (2013.01); *H01L 2933/0066* (2013.01); *H05K 1/181* (2013.01); *H05K 3/0052* (2013.01); *H05K 3/427* (2013.01); *H05K 2201/10106* (2013.01)

(56) References Cited

U.S. PATENT DOCUMENTS

| | | | | |
|---|---|---|---|---|
| 5,939,010 | A * | 8/1999 | Yuyama | H05K 3/0026 264/400 |
| 6,329,603 | B1 * | 12/2001 | Japp | H05K 3/4641 174/255 |
| 6,400,010 | B1 | 6/2002 | Murata | |
| 6,426,470 | B1 | 7/2002 | Farquhar et al. | |
| 6,826,830 | B2 * | 12/2004 | Egitto | H01L 21/4853 257/E23.106 |
| 7,002,080 | B2 | 2/2006 | Tani et al. | |
| 7,372,143 | B2 | 5/2008 | Nakamura et al. | |
| 7,881,069 | B2 * | 2/2011 | Inagaki | H01L 21/4857 361/763 |
| 8,026,526 | B2 * | 9/2011 | Weber-Rabsilber | H01L 33/44 257/100 |
| 8,058,562 | B2 * | 11/2011 | Kuramochi | H05K 1/0271 174/255 |
| 8,203,080 | B2 * | 6/2012 | Vasoya | H05K 3/4608 174/255 |
| 9,125,304 | B2 | 9/2015 | Wu et al. | |
| 9,299,895 | B1 | 3/2016 | Hsing Chen et al. | |
| 9,332,632 | B2 | 5/2016 | Schneider et al. | |
| 9,781,830 | B2 | 10/2017 | Iketani et al. | |
| 9,992,878 | B2 | 6/2018 | Sugane et al. | |
| 2003/0102291 | A1 * | 6/2003 | Liu | B23K 26/04 219/121.73 |
| 2003/0121699 | A1 | 7/2003 | Happoya | |
| 2005/0178585 | A1 | 8/2005 | Kim et al. | |
| 2005/0224988 | A1 * | 10/2005 | Tuominen | H01L 23/5389 257/774 |
| 2005/0247482 | A1 | 11/2005 | Nakamura | |
| 2005/0257957 | A1 | 11/2005 | Vasoya | |
| 2006/0012967 | A1 * | 1/2006 | Asai | G02B 6/43 361/764 |
| 2009/0098391 | A1 | 4/2009 | Nakagawa et al. | |
| 2010/0055392 | A1 * | 3/2010 | Appelt | H01L 21/486 428/137 |
| 2011/0108317 | A1 * | 5/2011 | Harrison | H01F 17/0033 174/266 |
| 2011/0303936 | A1 * | 12/2011 | Wu | H01L 33/62 257/98 |
| 2012/0129298 | A1 * | 5/2012 | Lin | H01L 25/16 438/118 |
| 2012/0135606 | A1 * | 5/2012 | Shimoi | H01L 21/30604 438/705 |
| 2012/0234587 | A1 | 9/2012 | Nakamura et al. | |
| 2012/0235309 | A1 * | 9/2012 | Essig | H01L 23/488 257/782 |
| 2012/0302124 | A1 * | 11/2012 | Imazu | H01L 33/486 445/58 |
| 2013/0240259 | A1 | 9/2013 | Yoshimura | |
| 2014/0251663 | A1 | 9/2014 | Iketani et al. | |
| 2015/0021304 | A1 * | 1/2015 | Ozawa | G06Q 10/043 219/121.7 |
| 2016/0247978 | A1 | 8/2016 | Ishida et al. | |

FOREIGN PATENT DOCUMENTS

| | | |
|---|---|---|
| JP | 2003-209330 | 7/2003 |
| JP | 2003-324263 | 11/2003 |
| JP | 2003-347736 | 12/2003 |
| JP | 2004-146427 | 5/2004 |
| JP | 2004-327532 | 11/2004 |
| JP | 2005-186110 | 7/2005 |
| JP | 2006-026665 | 2/2006 |
| JP | 2006-165242 | 6/2006 |
| JP | 2007-053134 | 3/2007 |
| JP | 2009-192783 | 8/2009 |
| JP | 2012-061480 | 3/2012 |
| JP | 2013-074261 | 4/2013 |
| JP | 2013-106034 | 5/2013 |
| JP | 2016-157918 | 9/2016 |

OTHER PUBLICATIONS

Notice of Allowance issued by the United States Patent and Trademark Office for the co-pending U.S. Appl. No. 16/744,175, dated Jan. 14, 2021.

* cited by examiner

PRINTED BOARD, LIGHT EMITTING DEVICE, AND METHOD FOR MANUFACTURING SAME

CROSS-REFERENCE TO RELATED APPLICATIONS

The present application claims priority under 35 U.S.C. § 119 to Japanese Patent Application No. 2016-192933, filed on Sep. 30, 2016, the contents of which are hereby incorporated by reference in their entirety.

BACKGROUND

1. Field of the Invention

The present disclosure relates to printed boards, light emitting devices, and method for manufacturing the same.

2. Description of Related Art

Printed boards often use a resin such as an epoxy resin or a polyimide resin as a material for an insulative base member of the printed boards. Some printed boards further include reinforcements such as glass cloths, like a glass epoxy board. Such printed boards including resin layers are provided with a plurality of through-holes for various purposes. Conventionally, through-holes have been formed by machine processing using drills, rooters, and the like. In recent years, through-holes are sometimes formed by laser machining, as for example disclosed in Japanese Patent Publication No. 2012-061480.

SUMMARY

A method for manufacturing a printed board according to an embodiment of the present disclosure includes steps of: providing a starting board comprising a base member having a plate-like shape, having an upper surface and a lower surface opposite the upper surface, and having an insulation property, a first metal layer disposed on the upper surface, and a second metal layer disposed on the lower surface; and laser machining a through-hole penetrating the starting board in a thickness direction of the starting board by irradiating a laser beam irradiation area of the starting board with a laser beam from a side of the starting board on which side the first metal layer is disposed. The method further includes a step of etching the second metal layer so as to remove a portion of the second metal layer located in the laser beam irradiation area, prior to the step of laser machining.

A printed board according to an embodiment of the present disclosure includes: a base member having a plate-like shape, having an upper surface and a lower surface opposite the upper surface, and having an insulation property; a first metal layer disposed on the upper surface; and a second metal layer disposed on the lower surface. The base member has a through-hole penetrating the base member in a thickness direction of the base member. The second metal layer is spaced apart from the through-hole by at least a predetermined distance in a bottom view.

BRIEF DESCRIPTION OF THE DRAWINGS

A more complete appreciation of embodiments of the invention and many of the attendant advantages thereof will be readily obtained by reference to the detailed description below when considered in connection with the accompanying drawings.

DETAILED DESCRIPTION

Figure 1:
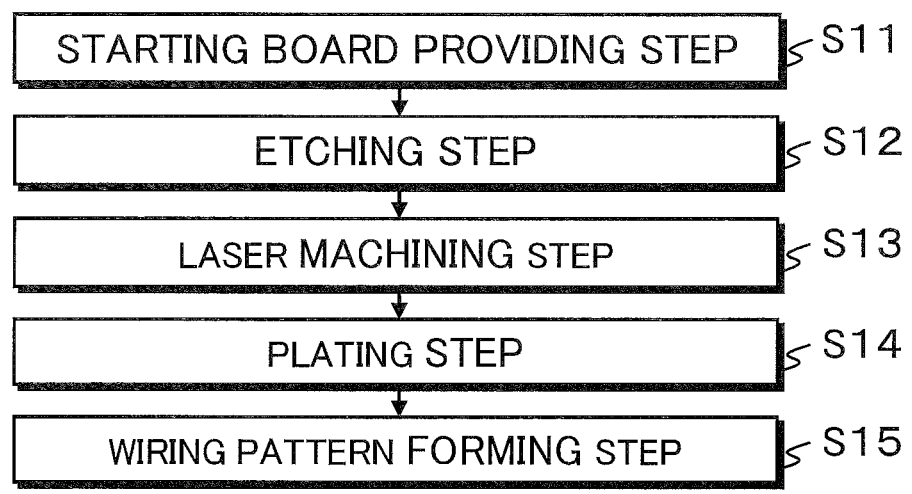
FIG. 1 is a flowchart illustrating the procedure of a method for manufacturing a printed board according to a first embodiment.

The embodiments will now be described with reference to the accompanying drawings, wherein like reference numerals designate corresponding or identical elements throughout the various drawings.

Hereinafter, a description is given of a printed board, light emitting devices, and manufacturing methods thereof according to embodiments of the present disclosure.

The drawings referenced in the following description schematically show the embodiments. Thus, the scale of members, distances between members, positional relations between members or the like may be presented in an exaggerated manner, and illustration of a part of a member may be omitted. Furthermore, the scale and distances between members may not match between a plan or bottom view and its corresponding cross-sectional view. In the description below, members that are the same or analogous are given the same name or number in principle, and duplicative detailed descriptions are appropriately omitted.

In the present specification, a board that has not been laser machined yet is called "starting board"; and a board that has been laser machined to have a through-hole formed is called "printed board".

In the present specification, a "through-hole" in a broad sense may mean: a point-like "through-hole" in a narrow sense, which can be formed without scanning a workpiece with a laser beam; and an "opening" that can be formed by scanning the workpiece with the laser beam.

Moreover, the "opening" may mean: "a hole having a shape substantially identical to a scanning line" that is formed by scanning the workpiece with the laser beam along straight and/or curved lines; and "a hole having a shape substantially identical to a predetermined area" that is formed by scanning the workpiece with a pulsed laser beam such as to surround the predetermined area.

First Embodiment

Printed Board and Manufacturing Method Thereof

Hereinafter, a description is given of a printed board according to a first embodiment and a method for manufacturing the printed board with reference to FIGS. 1 to 6C.

Figure 2:
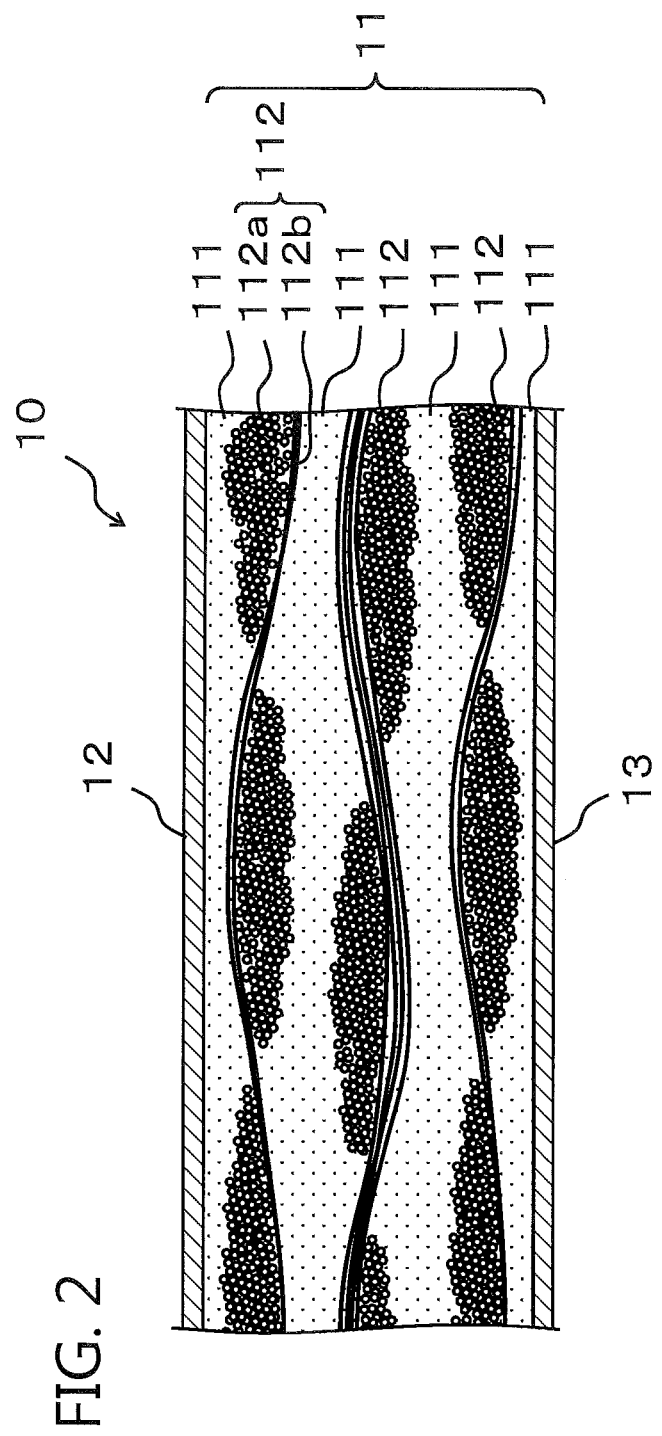
FIG. 2 is a cross-sectional view illustrating the configuration of a starting board used in the method for manufacturing the printed board according to the first embodiment.
Figure 3A:
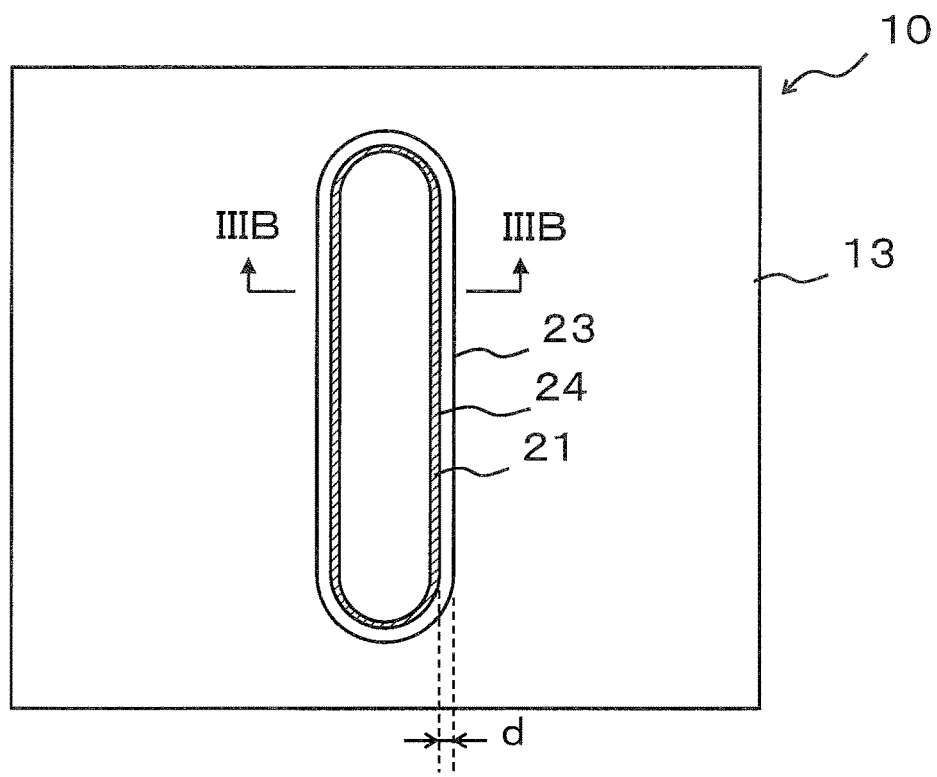
FIG. 3A is a plan view showing an etching step in the method for manufacturing the printed board according to the first embodiment.
Figure 3B:
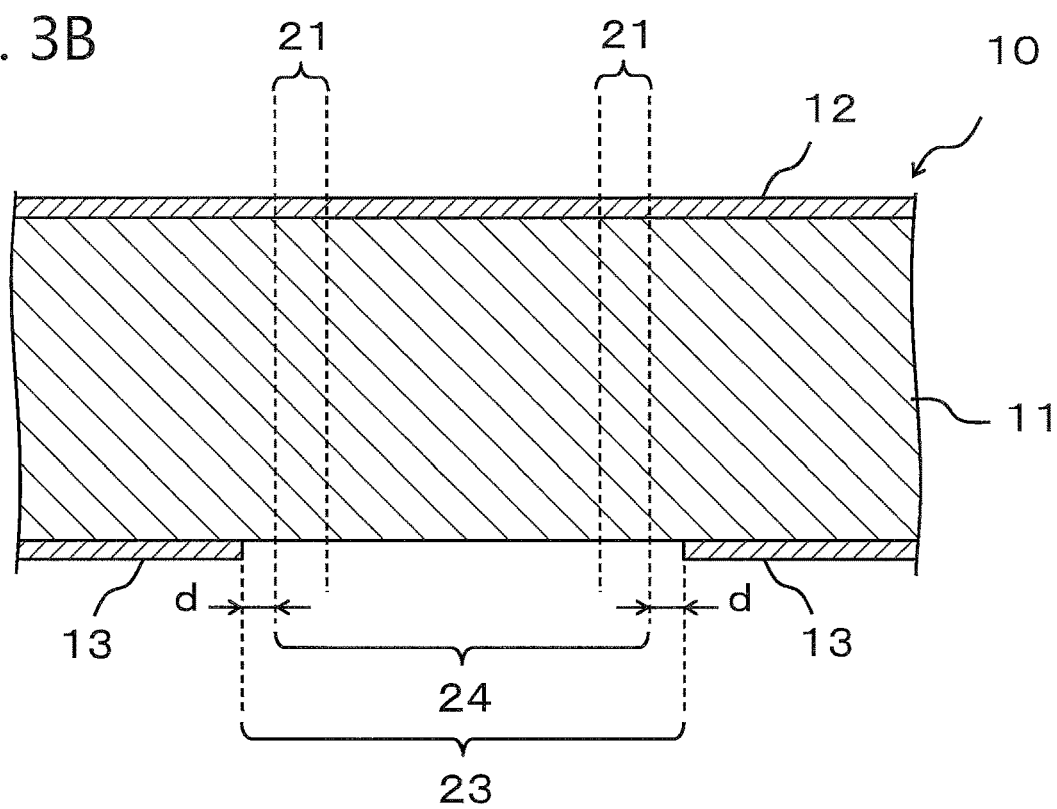
FIG. 3B is a cross-sectional view taken along line IIIB-IIIB in FIG. 3A showing an etching step in the method for manufacturing the printed board according to the first embodiment.
Figure 4A:
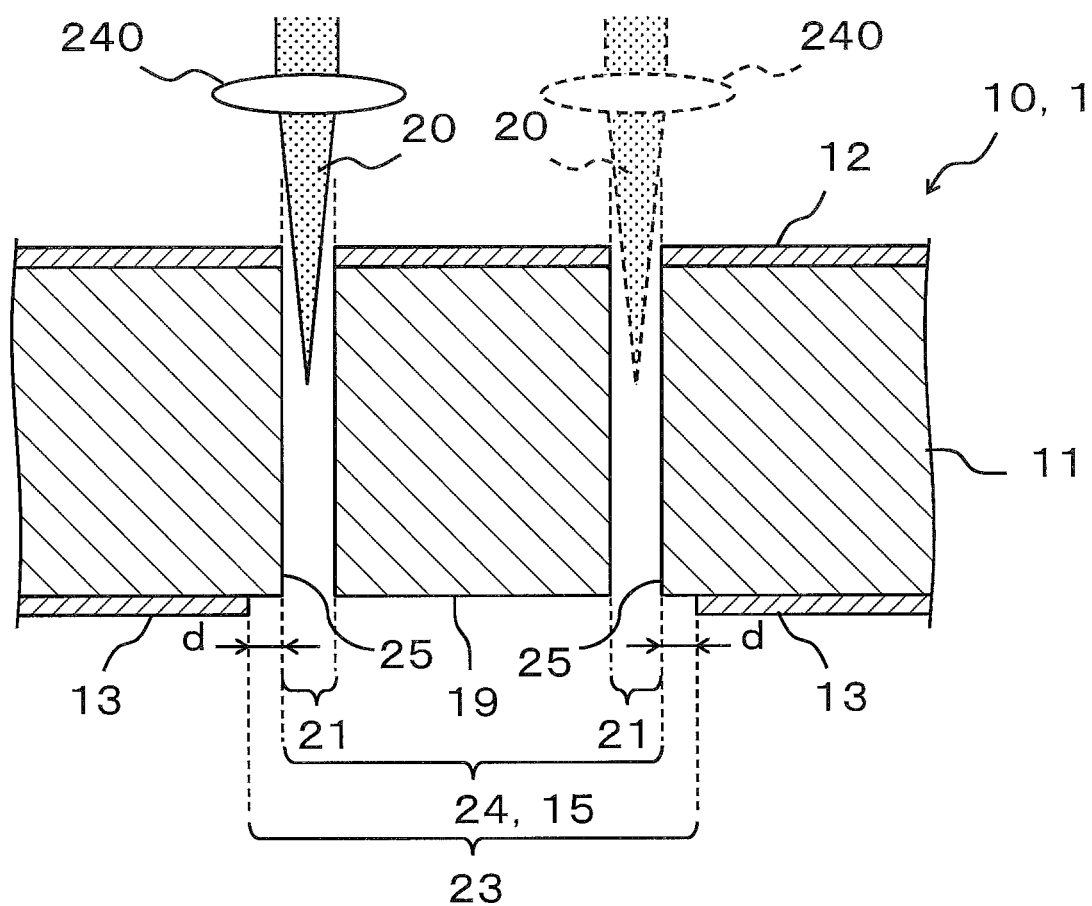
FIG. 4A is a cross-sectional view showing a laser machining step in the method for manufacturing the printed board according to the first embodiment.
Figure 4B:
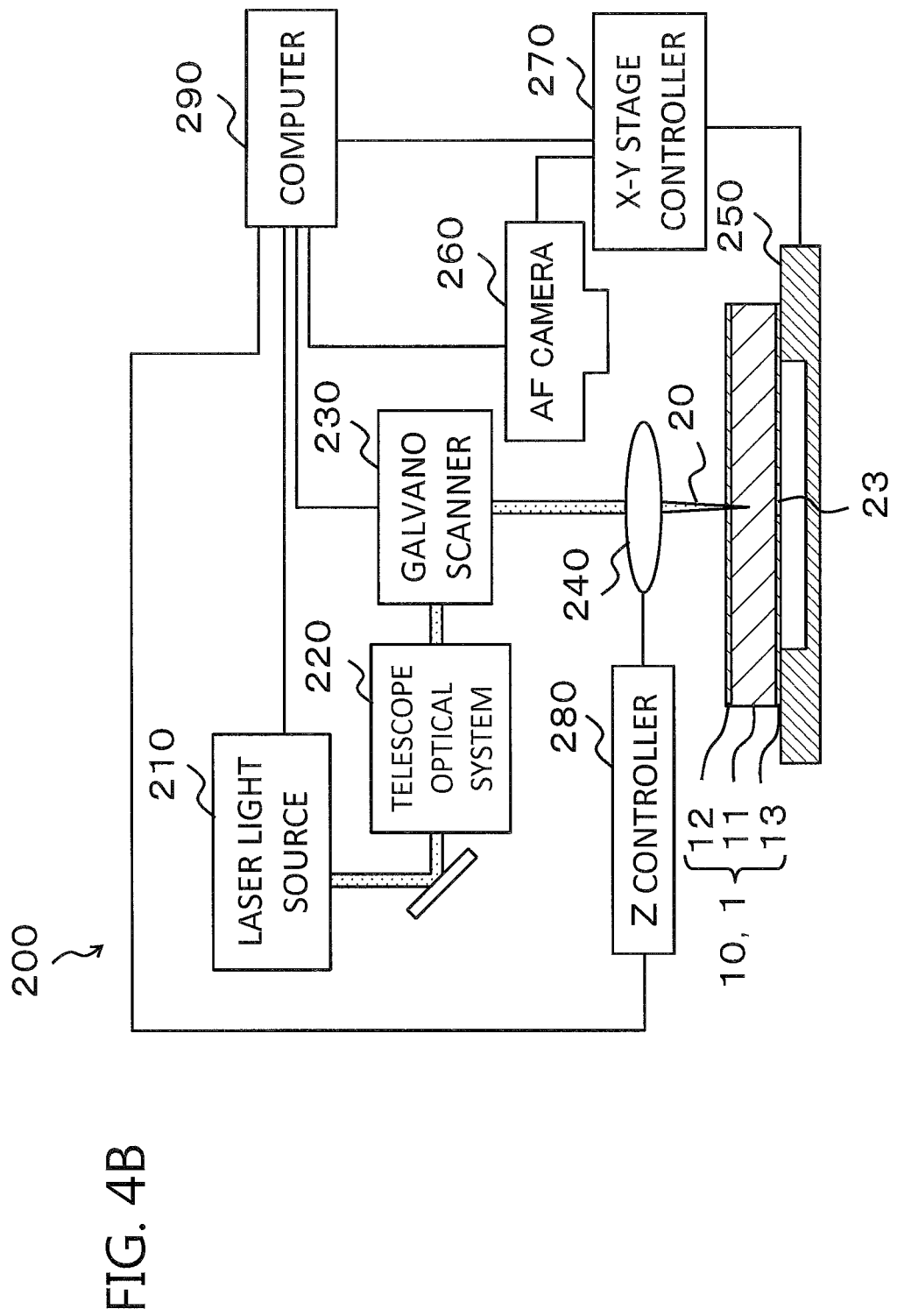
FIG. 4B is a block diagram illustrating the configuration of a laser machining apparatus used in a laser machining step in the method for manufacturing the printed board according to the first embodiment.
Figure 5:
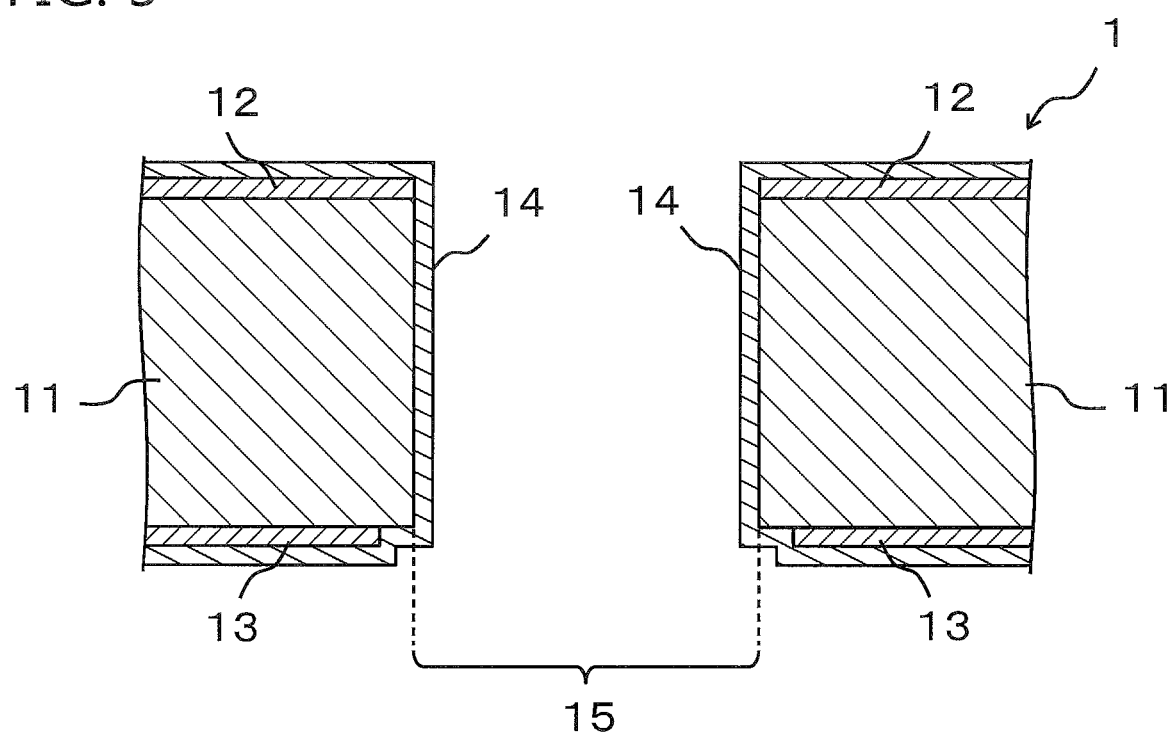
FIG. 5 is a cross-sectional view showing a plating step in the method for manufacturing the printed board according to the first embodiment.
Figure 6A:
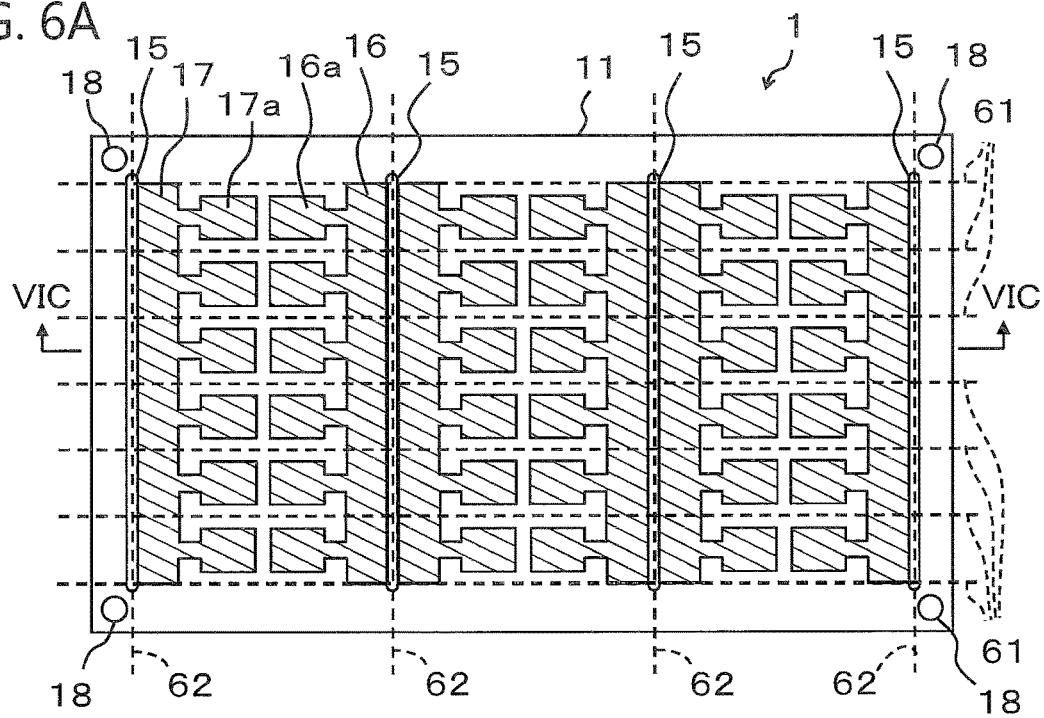
FIG. 6A is a plan view showing a wiring pattern forming step in the method for manufacturing the printed board according to the first embodiment.
Figure 6B:
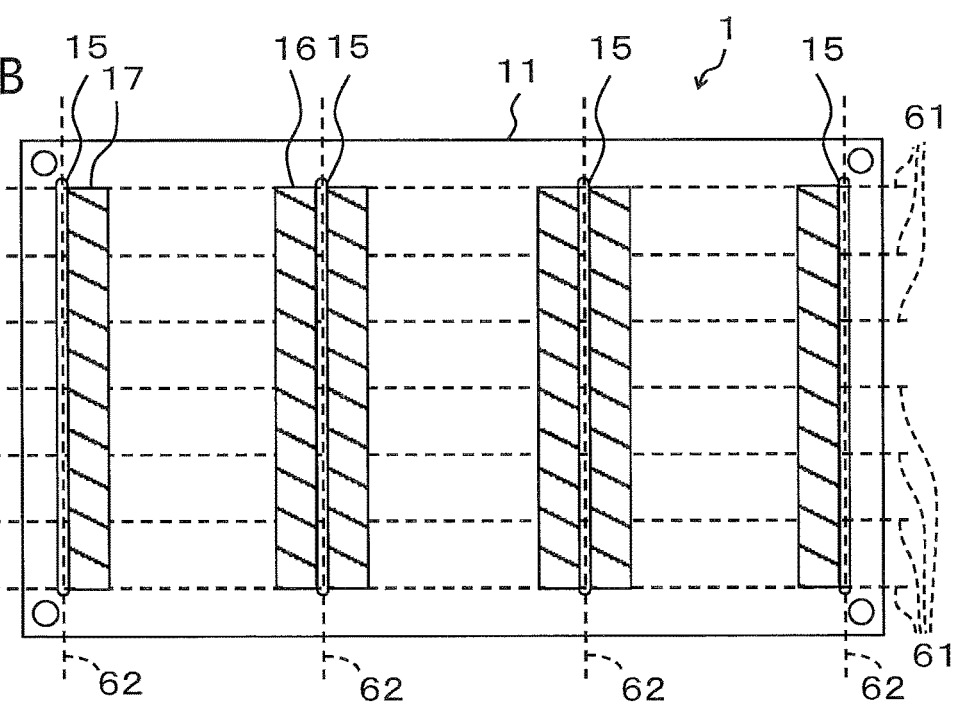
FIG. 6B is a bottom view showing the wiring pattern forming step in the method for manufacturing the printed board according to the first embodiment.
Figure 6C:
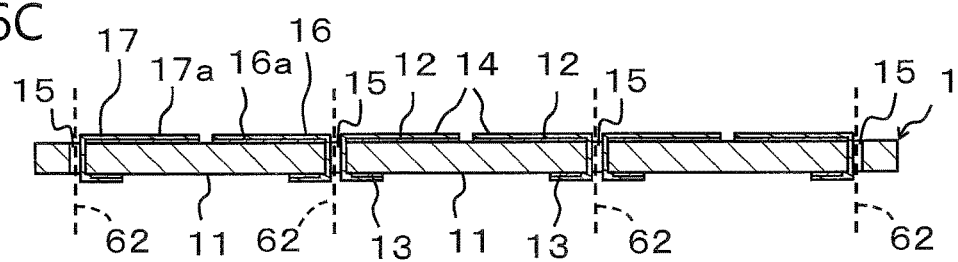
FIG. 6C is a cross-sectional view taken along line VIC-VIC in FIG. 6A showing the wiring pattern forming step in the method for manufacturing the printed board according to the first embodiment.

FIG. 1 is a flowchart illustrating the procedure of the method for manufacturing the printed board according to the first embodiment. FIG. 2 is a cross-sectional view of the configuration of a starting board used in the method for manufacturing the printed board according to the first embodiment. FIG. 3A is a plan view showing an etching step in the method for manufacturing the printed board according to the first embodiment. FIG. 3B is a cross-sectional view taken along line IIIB-IIIB in FIG. 3A showing the etching step in the method for manufacturing the printed board according to the first embodiment. FIG. 4A is a cross-sectional view showing a laser machining step in the method for manufacturing the printed board according to the first embodiment. FIG. 4B is a block diagram showing a configuration of a laser machining apparatus used in the laser machining step in the method for manufacturing the printed board according to the first embodiment. FIG. 5 is a cross-sectional view showing a plating step in the method for manufacturing the printed board according to the first embodiment. FIG. 6A is a plan view showing a wiring pattern forming step in the method for manufacturing the printed board according to the first embodiment. FIG. 6B is a bottom view showing the wiring pattern forming step in the method for manufacturing the printed board according to the first embodiment. FIG. 6C is a cross-sectional view taken along line VIC-VIC in FIG. 6C showing the wiring pattern forming step in the method for manufacturing the printed board according to the first embodiment.

Note that, in the bottom view shown in FIG. 3A, an area to be irradiated with a laser beam is shown with hatching for convenience. Note also that, in each cross-sectional view shown in FIG. 3B and subsequent figures, illustration of detailed configurations of a base member is omitted. Note also that, in the plan view shown in FIG. 6A and the bottom view shown in FIG. 6B, areas where a first metal layer, a second metal layer, or a third metal layer is remained as a wiring pattern are shown with hatching for convenience.

Configuration of Printed Board

As shown in FIGS. 6A to 6C showing a wiring pattern forming step, which is the final step, a printed board 1 manufactured by the manufacturing method according to the first embodiment includes: a base member 11 having a plate-like shape and having insulation properties; a first metal layer 12 disposed on an upper surface of the base member 11; a second metal layer 13 disposed on a lower surface of the base member 11; and openings 15 located at predetermined locations of the printed board 1 and penetrating the printed board 1 in a thickness direction thereof. The printed board 1 further has a third metal layer 14 that continuously cover the first metal layer 12, the second metal layer 13, and inner surfaces of the openings 15, to electrically connect the first metal layer 12 and the second metal layer 13. The first metal layer 12, the second metal layer 13, and the third metal layer 14 constitute a wiring pattern of the printed board 1. The printed board 1 of the present embodiment has corners at each of which a hole 18 for the positioning and handling of the printed board 1 is formed.

Detailed configuration of the printed board 1 is described below with a manufacturing method thereof.

Manufacturing Method of Printed Board

The method for manufacturing the printed board according to the first embodiment includes: a starting board providing step S11, an etching step S12, a laser machining step S13, a plating step S14, and a wiring pattern forming step S15.

The starting board providing step S11 provides a starting board 10, which is an original material of the printed board 1. The starting board 10 of the printed board 1 includes: the base member 11, which is a plate-shaped insulative member having an upper surface and a lower surface opposite the upper surface; the first metal layer disposed on the upper surface; and the second metal layer disposed on the lower surface.

The starting board 10 may be prepared by applying a metal foil on both surfaces of the base member 11 or by forming a metal film on both surfaces of the base member 11 by plating, sputtering, vapor deposition, or the like. The starting board 10 may be self-manufactured, or may be obtained commercially. The starting board 10 is, for example, a rigid board, but may be a flexible board.

The starting board 10 may have holes 18 for the positioning and handling of the starting board 10 or the printed board 1, separately from the openings 15 to be formed by laser machining Such holes 18 may be formed by a drill or rooter, for example.

The base member 11 is a laminate in which resin layers 111 and glass cloths 112 are alternately laminated, wherein each of the glass cloths 112 is woven with warp threads 112a and weft threads 112b. For the glass cloths 112, E-glass made of $SiO_2$—$Al_2O_3$—CaO—$B_2O_3$ or the like or S-glass made of $SiO_2$—$Al_2O_3$—MgO or the like may be used. The glass cloths 112 are impregnated with the resin constituting the resin layers 111, so that the resin layers 111 and the glass cloths 112 make the base member 11 integral and solid. The base member 11 preferably has at least three layers of glass cloths 112. This is because laminating a plurality of glass cloths reduces uneven distribution of the warp threads 112a and weft threads 112b in the glass cloths, thereby enabling producing a uniform surface finish when laser machining the base member 11.

The type of the resin constituting the resin layers 111 is not particularly limited. Examples of the resin constituting the resin layers 111 include epoxy resins, polyimide resins, polyethylene terephthalate resins, polyethylene naphthalate resins, bismaleimide triazine resins, phenolic resins, silicone resins, modified silicone resins, epoxy-modified silicone resins, polyphenylene ether resins, liquid crystal polymers, and combinations of the foregoing.

The base member 11 may optionally contain a reinforcement material for improving the strength of the base member 11, like the glass cloths 112 of the present embodiment. Examples of the reinforcement material include glass fibers, ceramics fibers, carbon fibers, aramid fibers, and combinations of the foregoing. The reinforcement material can be in the form of woven fabric, nonwoven fabric, paper, felt, or the like. The reinforcement material may be dispersed in the resin layers 111 as fillers.

Specific examples of the base member 11 include glass epoxy boards and polycarbonate boards. The thickness of the base member 11 can be, but is not limited to, about 200 μm to about 500 μm, for example.

In the starting board 10, the first metal layer 12 is disposed such as to cover the upper surface; and the second metal layer 13 is disposed such as to cover the lower surface. Each of the first metal layer 12 and the second metal layer 13 is a metal layer on which a wiring pattern of the printed board 1 is to be formed.

The first metal layer 12 and the second metal layer 13 have higher thermal conductivity than the base member 11, and thus serve to effectively dissipate excessive heat accumulated near the surfaces of the starting board 10 when the starting board 10 is subjected to laser machining. The first metal layer 12 and the second metal layer 13 also serve to block penetration of oxygen from the outside into the base member 11, in particular into the resin layer 111. Due to synergistic effects of those features, the first metal layer 12 and the second metal layer 13 suppresses the occurrence of unfavorable thermal damage such as burning or gouging during a laser machining operation. From this viewpoint, it is preferable that each of the first metal layer 12 and the second metal layer 13 cover the substantially entire surface of the base member 11 on which the metal layer is disposed.

The type of the metal that constitutes the first metal layer 12 and the second metal layer 13 is not particularly limited. However, the metal preferably has low electrical resistance from the viewpoint of using those metal layers as the wiring pattern of an electrical circuit. In addition, the metal constituting the first metal layer 12 and the second metal layer 13 preferably has high thermal conductivity from the viewpoint of suppressing the occurrence of unfavorable thermal damage in the laser machining step S13. Examples of the metal constituting the first metal layer 12 and the second metal layer 13 include one or more metal materials selected from the group consisting of Cu, Ag, Au, Ni, and Al, and an alloy containing these metals as a major component.

The first metal layer 12 and the second metal layer 13 may have any thickness so long as they function as wiring lines. Preferably, the first metal layer 12 and the second metal layer 13 have a thickness of at least 1 μm to function as wiring lines, and at most 18 μm so as not to require too much time for laser machining and not to generate an excessive amount of debris in laser machining. When the first metal layer 12 and/or the second metal layer 13 are partially removed by etching before laser machining, it is preferable that the first metal layer 12 and the second metal layer 13 each have a thickness of at most 105 μm before etching so as not to excessively consume material, though the upper limit of the thickness is not particularly limited to that value.

Depending on the metal materials used for the first metal layer 12 and the second metal layer 13, another metal layer may be interposed between the first metal layer 12 and the base member 11 and between the second metal layer 13 and the base member 11, for the purposes of improving adhesion and preventing migration of metal materials. Examples of such a metal layer include an Ni layer, a Cr layer, and an NiCr-alloy layer, each having a thickness of several hundred nanometers.

Prior to performing the laser machining step S13, in which laser beam irradiation areas 21 of the starting board 10 are irradiated with the laser beam 20, the etching step S12 etches the second metal layer 13 to remove portions of the second metal layer 13 located in the laser beam irradiation areas 21 and the vicinities thereof. This eliminates the need of partially removing the second metal layer 13 by laser machining, and thus accordingly reduces the number of scans of the laser beam 20.

To reduce the number of scans of the laser beam 20, in addition to the removal of the portions of the second metal layer 13 located in the laser beam irradiation areas 21 and the vicinities thereof, portions of the first metal layer 12 located in the laser beam irradiation areas 21 and the vicinities thereof may be removed. It is, however, preferable that at least the portions of the second metal layer 13 located in the laser beam irradiation areas 21 and the vicinities thereof be removed. In comparison to the first metal layer 12 disposed on the upper surface of the base member 11, on which upper surface the laser beam 20 is incident, the second metal layer 13 disposed on the lower surface of the base member 11 necessitates a larger number of scans of the laser beam 20 for laser machining and is likely to have processing anomaly in a cutting surface due to a thermal influence. For this reason, it is preferable that the portions of the second metal layer 13 located in the laser beam irradiation areas 21 and the vicinities thereof be removed to reduce processing time and improve processing quality. Meanwhile, removing the portions of the first metal layer 12 located in the laser beam irradiation areas 21 and the vicinities thereof disposed on the upper surface of the base member 11 allows for reduction of the amount of debris, in addition to the reduction of the number of the scans of the laser beam 20 in laser machining.

The etching of the second metal layer 13 may be performed in the same manner as that for forming a wiring pattern in conventional printed board manufacturing methods.

First, the first metal layer 12 and the second metal layer 13 is masked so as to expose portions of the second metal layer 13 located in second metal layer removal areas 23, which are to be removed by etching. Next, the portions of the second metal layer 13 exposed through the mask are removed by etching using appropriate etching solution, in accordance with the type of the metal used in the second metal layer 13.

In the present embodiment, each of the laser beam irradiation areas 21 is determined to have an annular shape in bottom view, such as an oval shape, a circular shape, an elliptical shape, and a polygonal shape, in accordance with the shape of opening formation areas 24 where the openings 15 are to be formed. The second metal layer removal areas 23, where the second metal layer 13 is partially removed by etching, are determined so as to include the laser beam irradiation areas 21. When through-holes in a narrow sense are to be formed, the second metal layer removal areas 23 are defined so as to include the through-holes. In other words, each of the second metal layer removal areas 23 is defined so as to be broader than the corresponding opening formation area 24. In more detail, the laser beam irradiation areas 21 respectively correspond to the outer edges of the opening formation areas 24, and each of the second metal layer removal areas 23 is defined so as to have an outer edge spaced apart outward from corresponding one of the laser beam irradiation areas 21 by a predetermined spaced distance d.

The predetermined spaced distance d, by which the outer edge of each of the second metal layer removal areas 23 is spaced apart from the corresponding one of the laser beam irradiation areas 21, is determined to be larger than a margin that is determined on the basis of the positional accuracy of irradiating the laser beam irradiation areas 21 with the laser beam 20 and the positional accuracy of removing the second metal layer 13 in the second metal layer removal areas 23 by etching. The spaced distance d is preferably at least 10 μm, or more preferably at least 20 μm. Setting the spaced distance d to an appropriate value allows for preventing the second metal layer 13 from being irradiated with the laser beam 20 even when an area irradiated with the laser beam 20 is shifted within positional accuracy. This ensures formation of annular through-grooves 25 at peripheries of the opening formation areas 24 even with a number of laser beam 20 scans reduced by the number of laser beam 20 scans required to remove the second metal layer 13. As a result, the openings 15 are formed with high reliability.

To efficiently dissipate heat accumulated in the base member 11 during laser machining, and to secure sufficient film strength of the third metal layer 14, which is formed on the inner surfaces of the openings 15 in the plating step S14, the spaced distance d is preferably as small as possible. For example, the spaced distance d is preferably at most 500 μm.

The laser machining step S13 forms through-holes in a broad sense in the starting board 10 having the second metal layer 13 in the second metal layer removal areas 23 removed, by irradiating the starting board 10 with the laser beam 20. When forming openings 15 as through-holes in a broad sense, the laser machining step S13 irradiates with the laser beam 20 the starting board 10 having the second metal layer 13 in the second metal layer removal areas 23 removed, along the laser beam irradiation areas 21 each configured to have an annular shape, from a side of the starting board 10 on which side the first metal layer 12 is formed. This irradiation with the laser beam 20 forms annular through-grooves 25 penetrating the starting board 10 in the thickness direction thereof. Each of the annular through-grooves 25 separates a portion 19 of the starting board 10 from the starting board 10. When the portion 19 free-falls or is pushed out by air-blowing from above or below the starting board 10, an opening 15 is formed in the starting board 10. The above steps manufacture printed board 1.

Note that when a through-hole in a broad sense is formed by laser machining without scanning of the laser beam 20, a through-hole having a point-like shape in a plan view is formed instead of an annular through-groove 25.

In more detail, the irradiation with the laser beam 20 is performed such that, for each of the opening formation areas 24, scanning of the laser beam 20 is circularly performed for a plurality of times along the corresponding laser beam irradiation area 21 defined at the periphery of the opening formation area 24 in an annular shape. The number of scans of the laser beam 20 is determined in accordance with the conditions of the laser beam 20, such as type, power, and fluence, and the materials and thicknesses of the first metal layer 12 and the base member 11 used for the starting board 10. In the present embodiment, the second metal layer 13 in each of the laser beam irradiation areas 21 and the vicinities thereof has been removed in advance at the etching step S12. Thus, the second metal layer 13 is not subjected to laser machining. This means that the total number of scans of the laser beam 20 can be reduced by the number of scans required to remove the second metal layer 13.

Hereinafter, a description is given of an exemplary case in which the starting board 10 is a glass epoxy board, the first metal layer 12 and the second metal layer 13 each include copper foil having a thickness of several micrometers, and the base member 11 has a thickness of several hundred micrometers. In this case, assuming that the laser machining for forming one through-groove 25 requires about 60 scans of a laser beam without removing the second metal layer 13 in advance, the number of scans can be reduced to about 40 to 45 by removing the second metal layer 13 in advance. Reduction of the number of scans leads to reduction of laser machining time. For example, 90 minutes of laser machining time may be reduced to about 60 to 70 minutes. In contrast, the time required for etching the first metal layer 12 and the second metal layer 13 is, for example, about one minute per sheet when they are continuously processed. Thus, total productivity is increased by performing the etching step S12 and then performing the laser machining step S13.

The scanning of the laser beam 20 in an annular path may be either in a clockwise or counterclockwise direction. The depth of the focal point of the laser beam 20 in the thickness direction of the starting board 10 may be set constant regardless of the progress of laser machining, or may be varied depending on the progress of laser machining. For example, when the starting board 10 has a non-uniform thickness, the depth of the focal point of the laser beam 20 may be varied depending on the thickness of the starting board 10 at the machining position thereof.

Preferably, when the laser beam 20 is scanned for a plurality of times, the laser beam 20 are scanned such that the time interval between irradiation cycles at any point irradiated with the laser beam 20 is at least 5 milliseconds. The scanning of the laser beam 20 in this way enables to effectively dissipate excessive thermal energy accumulated in the base member 11 into the first metal layer 12 and the second metal layer 13 within the cycle time interval, and thus suppress the occurrence of thermal damage in the laser machining portion of the base member 11.

The laser beam 20 is not particularly limited to a specific type of laser beam so long as the laser beam 20 is capable of forming through-grooves 25 in the starting board 10 appropriately. However, preferred characteristics of the laser beam 20 are as follows.

The laser beam 20 is preferably a pulsed laser, which is capable of providing instantaneous high-power, to suppress the thermal influence on the starting board 10. The use of the pulsed laser facilitates processing of starting boards 10 of various materials and thicknesses.

When a pulsed laser is used as the laser beam 20, it is preferable that the following conditions be satisfied.

Preferably, the laser beam 20 has an oscillation wavelength of 250 nm to 2000 nm, or more preferably 250 nm to 1500 nm, from the viewpoint of suppressing the occurrence of unfavorable thermal damage in the laser machining portions of the base member 11. For example, the wavelength of the laser beam 20 is 355 nm.

Preferably, the laser beam 20 has a power of at least 10 W from the viewpoint of increasing laser machining speed. There is no particular upper limit on the power of the laser beam 20 so long as the total irradiation energy determined for the combination of pulse frequency and scan speed of the laser beam 20 are suitable to the starting board 10 to be machined. Thus, a laser beam having a power of about 60 W may be used for the laser beam 20, for example.

Preferably, the laser beam 20 has a pulse width of 10 picoseconds to 100 nanoseconds, from the viewpoint of improving laser machining quality.

Preferably, the laser beam 20 has a pulse frequency of 100 kHz to 3 MHz, more preferably 1 MHz to 3 MHz, from the viewpoint of improving laser machining quality.

Preferably, when for example the wavelength of the laser beam 20 is 355 nm, the laser beam 20 has an energy of at least 3 µJ, from the viewpoint of increasing laser machining speed. Preferably, in addition, when the wavelength of the laser beam 20 is 355 nm, from the viewpoint of increasing laser machining speed, the laser beam 20 has a fluence of at least 3 $J/cm^2$ at the upper surface of the starting board 10, and has a fluence of at least 10 $J/cm^2$ at the focal point of the laser beam 20.

Preferably, the laser beam 20 has a beam width or diameter of 10 µm to 30 µm from the viewpoint of enabling narrow pitch processing by laser machining.

Preferably, the scan speed of the laser beam 20 is 1000 mm/s to 3000 mm/s form the viewpoint of increasing laser machining speed.

A dry film may be laminated on the upper surface and/or lower surface of the printed board 1 when laser machining the printed board 1. This prevents debris generated in laser machining from directly adhering to the upper surface and/or lower surface of the starting board 10. The debris is readily removed by removing the dry film after laser machining.

Laser Machining Apparatus

Next, a description is given of an example of a laser machining apparatus used in the laser machining step S13. A laser machining apparatus 200 forms through-holes in a broad sense in the starting board 10 by irradiating the starting board 10 with the laser beam 20, wherein the starting board 10 is constructed of the base member 11 having an upper surface and a lower surface on which the first metal layer 12 and the second metal layer 13 are respectively disposed. In the starting board 10, the areas to be irradiated with the laser beam 20 are in the second metal layer removal areas 23, where the second metal layer 13 has been removed.

The laser machining apparatus 200 includes at least the following components: a laser light source 210 that emits the laser beam 20; a stage 250; an optical system that guides the laser beam 20 emitted from the laser light source 210 to a starting board 10 placed on the stage 250; a scanning section that causes the starting board 10 placed on the stage 250 and the focal point of the laser beam 20 to move relative to each other; and a control section that controls operations of the scanning section. Hereinafter, a description is given of each of those components.

The laser light source 210 emits the laser beam 20 for irradiation of the starting board 10. The type of laser used for the laser light source 210 is not particularly limited. An appropriate laser is selected on the basis of the type or the like of the starting board 10. Examples of the laser include a fiber laser.

As the optical system, the present example of the laser machining apparatus 200 is provided with a telescope optical system 220 and an fθ lens 240, as well as mirrors as appropriate. As the scanning section, the present example of the laser machining apparatus 200 is also provided with the stage 250, a galvano scanner 230, an X-Y stage controller 270, and a Z controller 280. The X-Y stage controller 270 drives the stage 250. As the control section, the present example of laser machining apparatus 200 is also provided with a computer 290.

The laser machining apparatus 200 may further be provided with an AF camera 260 or the like, to have an automatic aiming system that positions a focal point of the laser beam 20 at a desired location in the starting board 10.

The laser light source 210 emits the laser beam 20 having a predetermined wavelength. As described earlier, the type of laser used for the laser light source 210 is appropriately selected on the basis of the type or the like of the starting board 10 to be machined.

The telescope optical system 220 optimizes the beam diameter of the laser beam 20 emitted from the laser light source 210, to obtain a preferred shape by machining.

According to instructions from the computer 290, the galvano scanner 230 varies the direction of travel of the laser beam 20 optimized by the telescope optical system 220. The laser beam 20 whose direction of travel is controlled by the galvano scanner 230 is focused at a focal point in the starting board 10 by the fθ lens 240, which is a focusing lens. Such a combination of the galvano scanner 230 and the fθ lens 240 is capable of focusing and scanning the laser beam 20 along the outer edges of the opening formation areas 24 at a constant speed.

The stage 250 has a table on which to place the starting board 10 as well as a drive mechanism capable of moving the table. The drive mechanism is capable of moving the table either in an X-axis or Y-axis direction and rotate the table about the X-axis or Y-axis. The starting board 10 on the stage 250 can be moved by the drive mechanism in the XY-axis direction.

The AF camera 260 is an automatic focusing camera for obtaining the surface profile of laser machined portions of the starting board 10. The obtained surface profile is output to the computer 290.

In accordance with instructions from the computer 290, the X-Y stage controller 270 causes the stage 250 to move in the XY-plane so as to position the focal point of the laser beam 20 on the outer edge of one of the opening formation areas 24 of the starting board 10.

In accordance with instructions from the computer 290, the Z controller 280 causes the fθ lens 240 to move in the Z direction so as to position the focal point of the laser beam 20 in the starting board 10.

The computer 290 is connected with the laser light source 210, the galvano scanner 230, the AF camera 260, the X-Y stage controller 270, and the Z controller 280, and controls the foregoing components generally. For example, the computer 290 controls the AF camera 260 and the X-Y stage controller 270 to get the surface profile of the starting board 10. In addition, the computer 290 controls the galvano scanner 230 and the Z controller 280 to make them circularly scan each of the opening formation areas 24 along the outer edge thereof with the laser beam 20 for a plurality of times. In addition, the computer 290 controls the X-Y stage controller 270 to cause the stage 250 to move so that the outer edge of each of the opening formation areas 24 can be irradiated with the laser beam 20.

Next, a description is given of the laser machining step S13, which includes a procedure for forming an opening 15 in the starting board 10 using the laser machining apparatus 200.

First, the procedure places the starting board 10 on the table of the stage 250, and gets the surface profile of the starting board 10 using the AF camera 260 and the X-Y stage controller 270.

Subsequently, the procedure makes the X-Y stage controller 270 move the starting board 10 to a predetermined location, and make the laser light source 210 emit the laser beam 20 to irradiate the starting board 10 with the laser beam 20. In this operation, the procedure varies the direction of travel of the laser beam 20 by the galvano scanner 230 such as to circularly scan an opening formation area 24 along the outer edge thereof with the laser beam 20 for a plurality of times. Preferably, the laser beam 20 is scanned such that the time interval between irradiation cycles at any point on the outer edge of the opening formation area 24 is at least 5 milliseconds. For example, the procedure may stop the irradiation with the laser beam 20 for a predetermined period of time per one cycle so that the time interval between irradiation cycles at any point on the outer edge of the opening formation area 24 is at least 5 milliseconds. Irradiating the starting board 10 with the laser beam 20 in this manner makes it possible, while suppressing the occurrence of unfavorable thermal damage such as burning or gouging, to form a through-groove 25 that reaches the back surface of the starting board 10, along the outer edge of the opening formation area 24. When a plurality of the openings 15 are to be formed, the above mentioned steps are repeated after making the X-Y stage controller 270 move the starting board 10.

The plating step S14 performs plating on the printed board 1 in which openings 15 have been formed, in order to form a third metal layer 14, which is a plating film that continuously covers the first metal layer 12, the second metal layer 13, and inner surfaces of the openings 15. By forming the third metal layer 14, an electrical connection is made between the first metal layer 12 and the second metal layer 13 through the openings 15, wherein the first metal layer 12 serves as a wiring pattern on the upper surface of the printed board 1 and the second metal layer 13 serves as a wiring pattern on the lower surface of the printed board 1.

Although the third metal layer 14 may be made of a metal different from the first metal layer 12 and the second metal layer 13, but is preferably made of the same type of metal as the first metal layer 12 and the second metal layer 13. For example, when the first metal layer 12 and the second metal layer 13 are made of Cu or a Cu alloy, the third metal layer 14 is preferably formed by a Cu-plating process. Using the same type of metal as the first metal layer 12 and the second metal layer 13 for the third metal layer 14 may increase the adhesion of the third metal layer 14 with the first metal layer 12 and the third metal layer 14.

The wiring pattern forming step S15 forms predetermined wiring patterns by etching the first metal layer 12, the second metal layer 13, and the third metal layer 14. The wiring pattern forming step S15 forms a mask on areas of the first metal layer 12, the second metal layer 13, and the third metal layer 14 where wiring electrodes are to be left, and removes portions of those metal layers exposed from the mask by an etching solution suitable to the metals used in those metal layers, forming wiring patterns.

In the present embodiment, as shown in FIGS. 6A to 6C, the openings 15 of the printed board 1 each have a narrow slit-shape. In an area between each two adjacent ones of the openings 15, wiring electrodes 16 and wiring electrodes 17 are formed such as to be spaced apart with each other in a lateral direction of the two adjacent openings 15, on both the upper surface and the lower surface of the printed board 1. On the upper surface of the printed board 1, the wiring electrode 16 and the wiring electrode 17 constitute pairs of element mounting part 16a and element mounting part 17a. In each of the pairs, the element mounting part 16a is for bonding with one electrode of a light emitting element to be mounted, and the element mounting part 17a is for bonding with the other electrode of the light emitting element. On the lower surface of the printed board 1, which lower surface is to be mounted on other circuit board, the wiring electrode 16 and the wiring electrode 17 have a spaced distance therebetween greater than a spaced distance between the wiring electrode 16 and the wiring electrode 17 on the upper surface of the printed board 1.

On the printed board 1 of the present embodiment, boundary lines 61 each extending in a length direction of the printed board 1 and boundary lines 62 each extending in a width direction of the printed board 1 define light emitting element areas each of which is used for a mounting board for mounting a light emitting element. In other words, the printed board 1 is produced as a collective board in which a plurality of light emitting device mounting boards are gathered. As described later in detail, light emitting devices are manufactured by mounting a light emitting element on the element mounting parts 16a, 17a in each of the light emitting element areas and dividing the printed board 1 along the boundary lines 61, 62.

Note that the wiring patterns are not limited to those described above and may be formed in various shapes for respective purposes. For example, the wiring pattern may be formed so as to configure a circuit containing a protective element in addition to an light emitting element in each of the light emitting devices. The printed board 1 is not limited to a collective board for manufacturing a plurality of light emitting devices, in which collective board a plurality of mounting boards are gathered, but may be configured so as to produce one light emitting device as a whole.

The above performed steps are able to manufacture the printed board 1.

Variant Examples

Figure 7A:
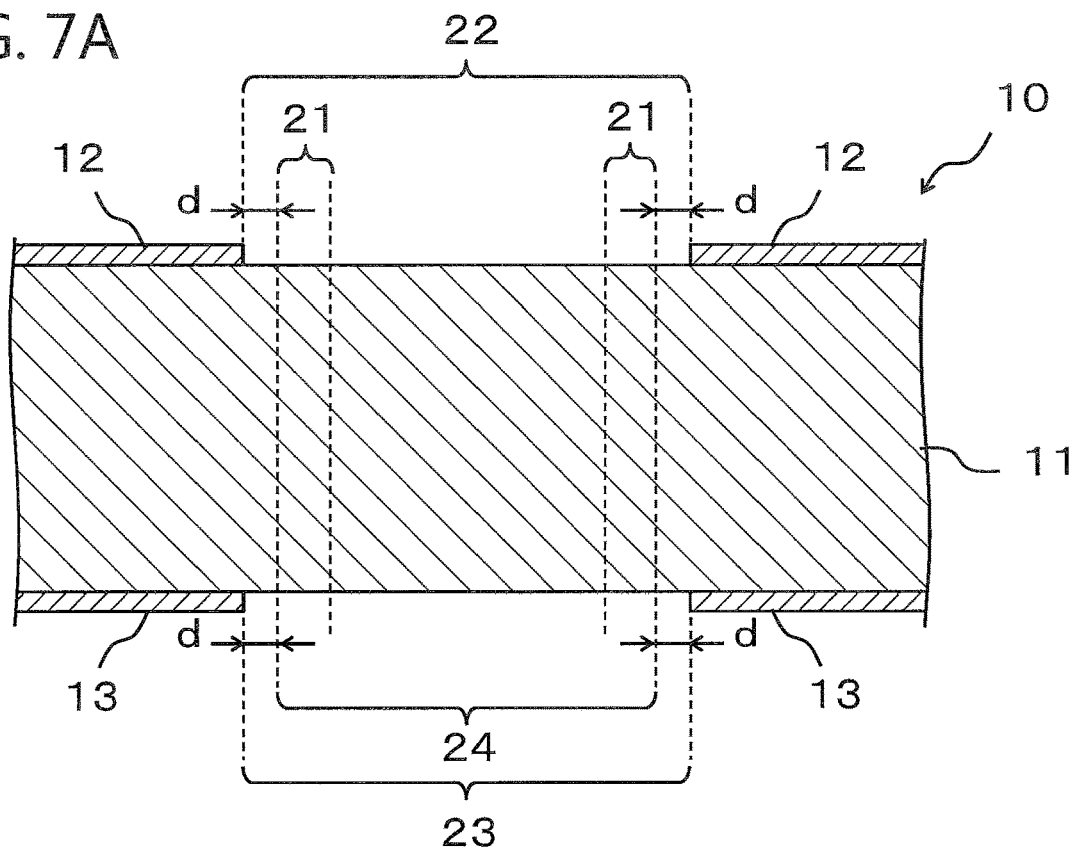
FIG. 7A is a cross-sectional view showing a first variant embodiment of the etching step in the method for manufacturing the printed board according to the first embodiment.
Figure 7B:
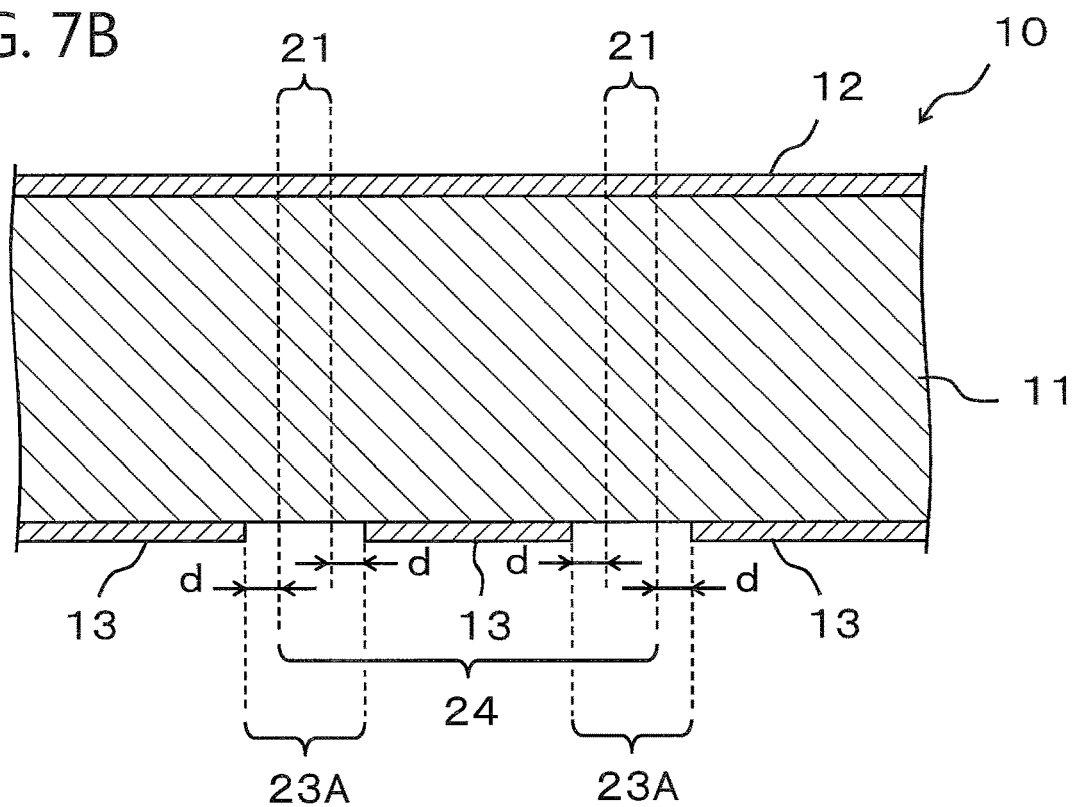
FIG. 7B is a cross-sectional view showing a second variant embodiment of the etching step in the method for manufacturing the printed board according to the first embodiment.

Next, a description is given of variants of the printed board manufacturing method with reference to FIGS. 7A and 7B. FIG. 7A is a cross-sectional view showing a first variant embodiment of the etching step in the method for manufacturing the printed board according to the first embodiment. FIG. 7B is a cross-sectional view showing a second variant embodiment of the etching step in the method for manufacturing the printed board according to the first embodiment.

First Variant Embodiment

A method for manufacturing a printed board according to a first variant embodiment partially removes the first metal layer 12, which is disposed on the upper surface of the starting board 10, in the above described etching step S12, in addition to removing the second metal layer 13 in the second metal layer removal areas 23. Specifically, the etching step S12 removes portions of the first metal layer 12 in first metal layer removal areas 22 defined in the laser beam irradiation areas 21 and the vicinities thereof in a plan view. The other steps are performed in the same manner as the method for manufacturing a printed board according to the first embodiment.

In addition to removing the second metal layer 13 in the second metal layer removal areas 23, removing the first metal layer 12 in the laser beam irradiation areas 21 and the vicinities thereof in advance further reduces the number of scans of the laser beam 20 in the laser machining step S13.

Note that, in the first variant embodiment, the first metal layer removal areas 22 are defined such as to overlap with the second metal layer removal areas 23 in a plan view, but are not limited to this configuration. The first metal layer removal areas 22 may not necessarily be defined such as to completely overlap with the second metal layer removal areas 23 in a plan view, so long as conditions similar to those imposed on the second metal layer removal areas 23 are satisfied.

Second Variant Embodiment

A method for manufacturing a printed board according to a second variant embodiment removes portions of the second metal layer 13 in second metal layer removal areas 23A defined in the laser beam irradiation areas 21 and the vicinities thereof within a predetermined spaced distance d in a plan view, in the above described etching step S12, instead of removing the portions of the second metal layer 13 in the second metal layer removal areas 23. That is, a portion of the second metal layer 13 inside each of the opening formation areas 24 is left without being removed. The other steps are performed in the same manner as the method for manufacturing a printed board according to the first embodiment.

Even in the second variant embodiment, because the second metal layer 13 in the laser beam irradiation areas 21 and the vicinities thereof are removed in advance, the number of scans of the laser beam 20 can be reduced like the first embodiment shown in FIGS. 3A and 3B. In addition, due to the portions of the second metal layer 13 left inside the opening formation areas 24, excessive thermal energy stored in the base member 11 can be effectively dissipated via the left portion of the second metal layer 13, and thus the occurrence of thermal damage in the laser machining portion of the base member 11 can further be suppressed.

Also, in the first variant embodiment, the first metal layer 12 may be processed like the second variant embodiment such that the first metal layer removal areas 22 are defined as the laser beam irradiation areas 21 and the vicinities thereof within a spaced distance d.

Second Embodiment

Light Emitting Device and Manufacturing Method of the Same

Figure 8:
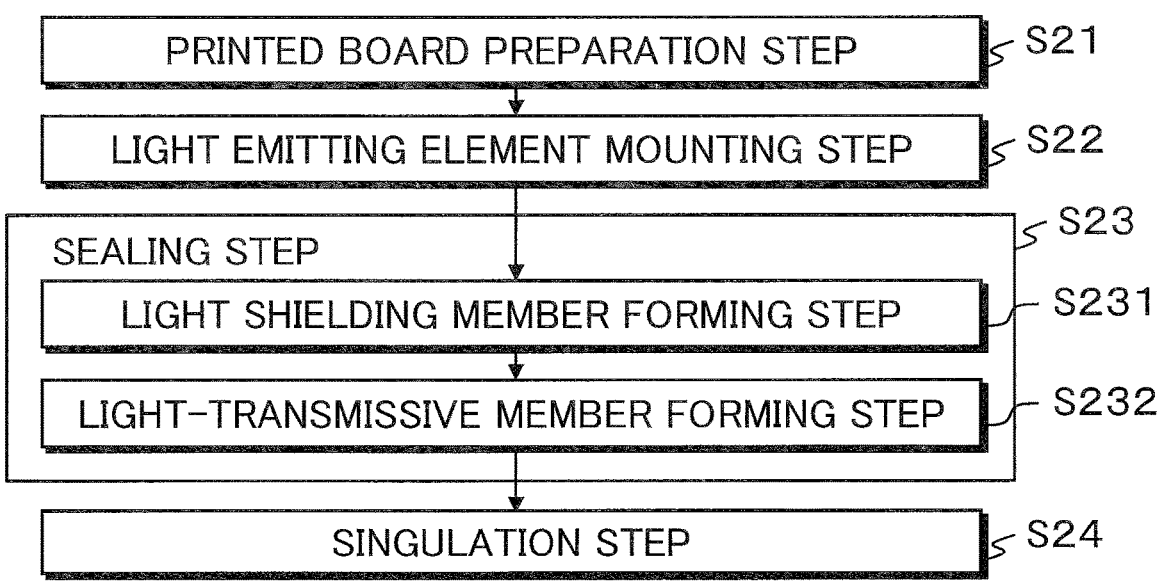
FIG. 8 is a flowchart of a method for manufacturing light emitting devices according to a second embodiment.
Figure 9A:
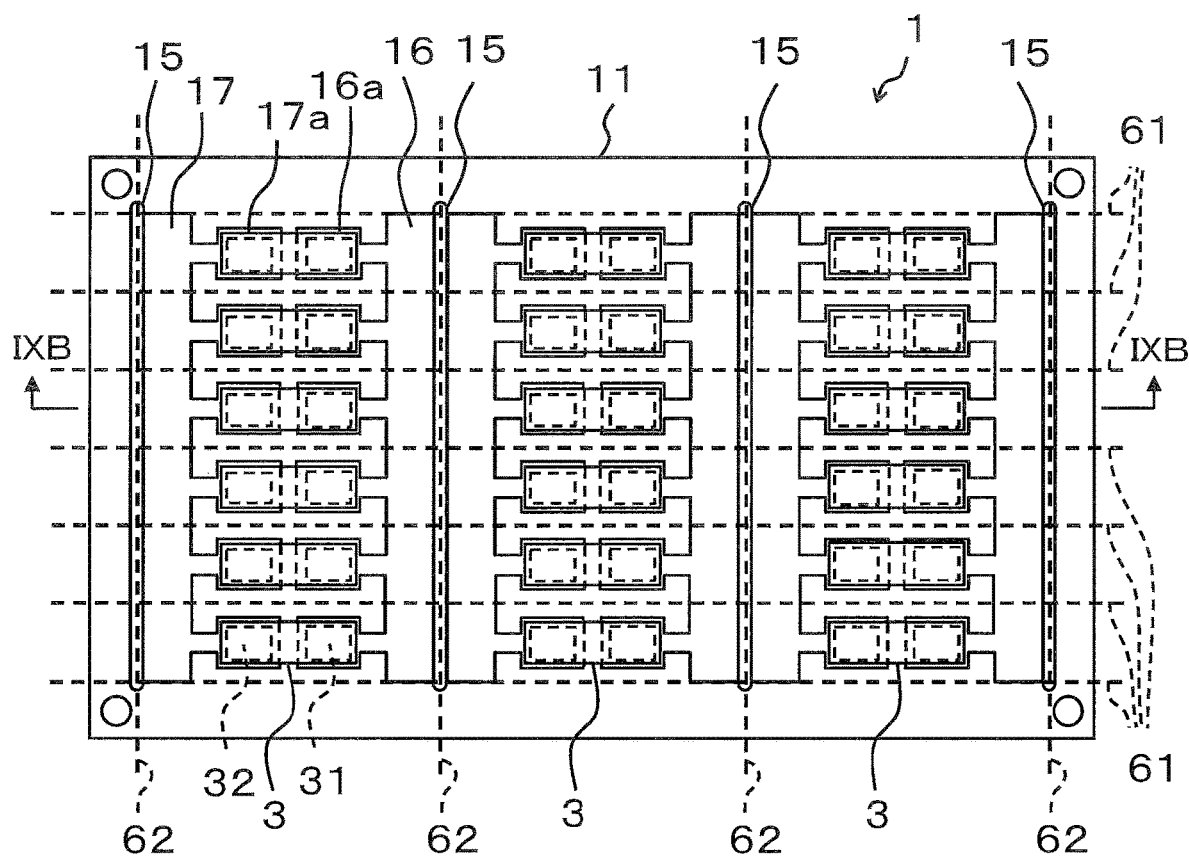
FIG. 9A is a plan view showing a light emitting element mounting step in the method for manufacturing the light emitting devices according to the second embodiment.
Figure 9B:
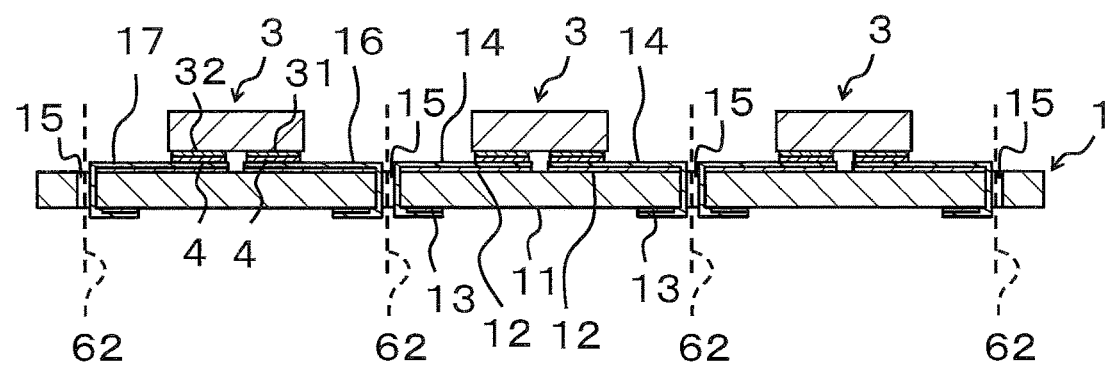
FIG. 9B is a cross-sectional view taken along line IXB-IXB in FIG. 9A showing the light emitting element mounting step in the method for manufacturing the light emitting devices according to the second embodiment.
Figure 10A:
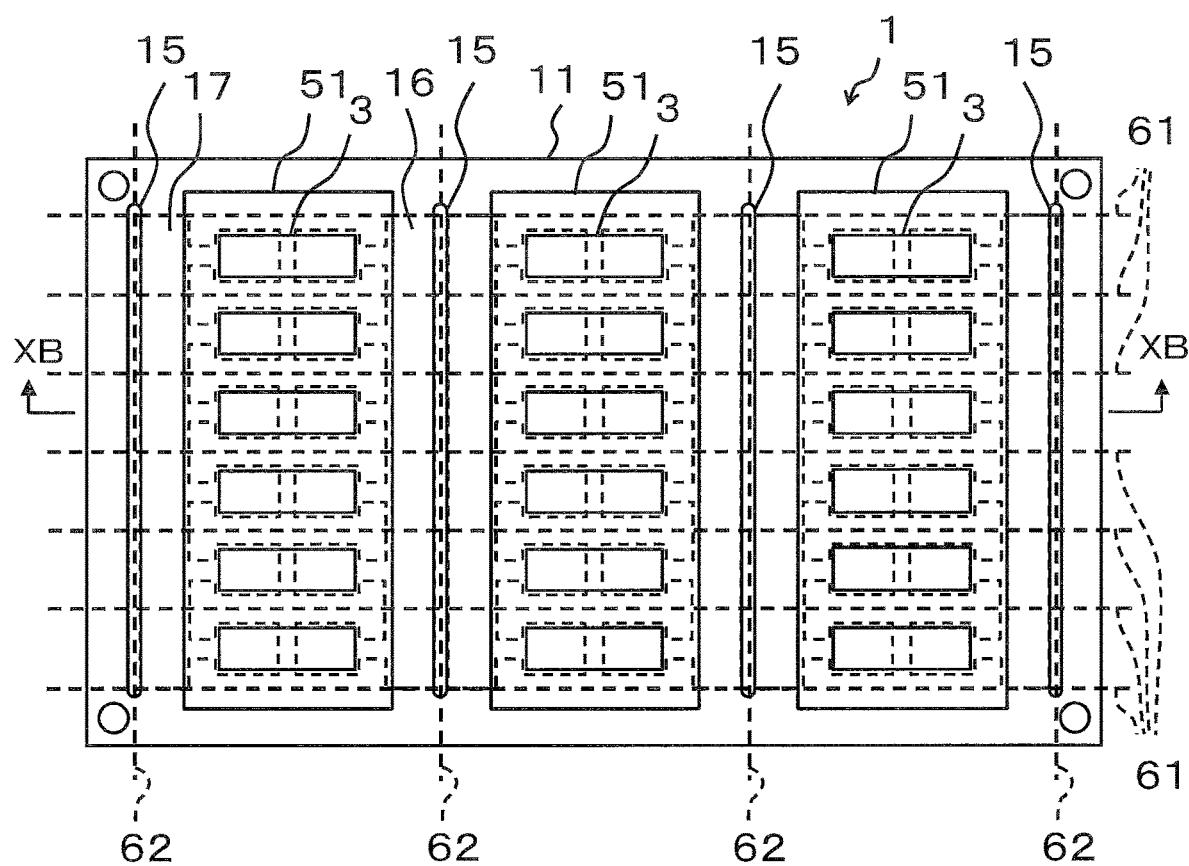
FIG. 10A is a plan view showing a light shielding member forming step in the method for manufacturing the light emitting devices according to the second embodiment.
Figure 10B:
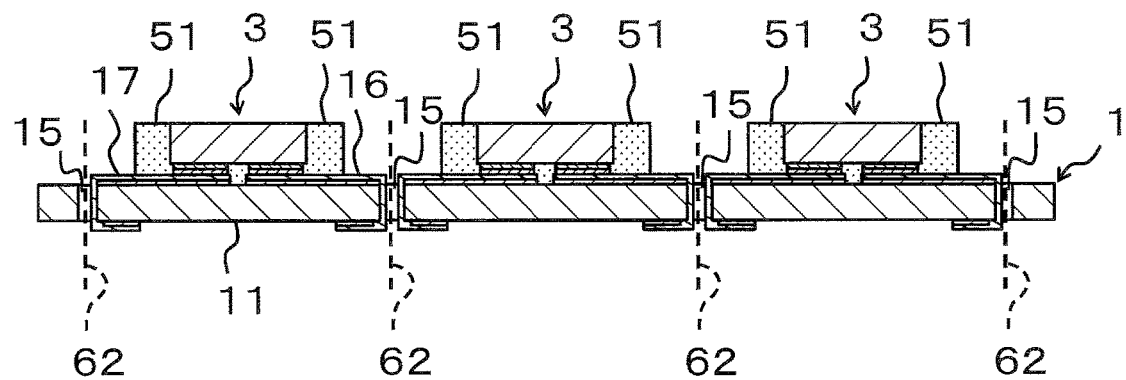
FIG. 10B is a cross-sectional view taken along line XB-XB in FIG. 10A showing the light shielding member forming step in the method for manufacturing the light emitting devices according to the second embodiment.
Figure 11A:
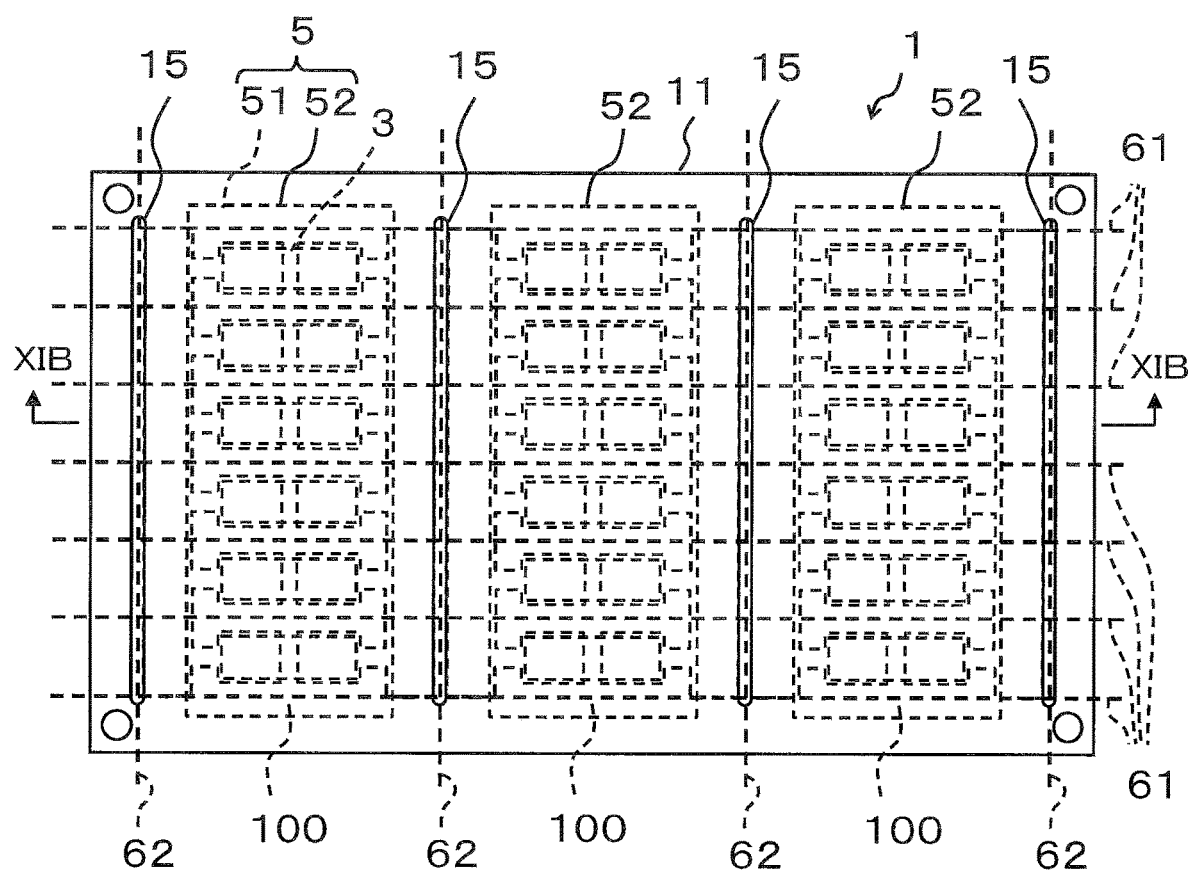
FIG. 11A is a plan view showing a light-transmissive member forming step in the method for manufacturing the light emitting devices according to the second embodiment.
Figure 11B:
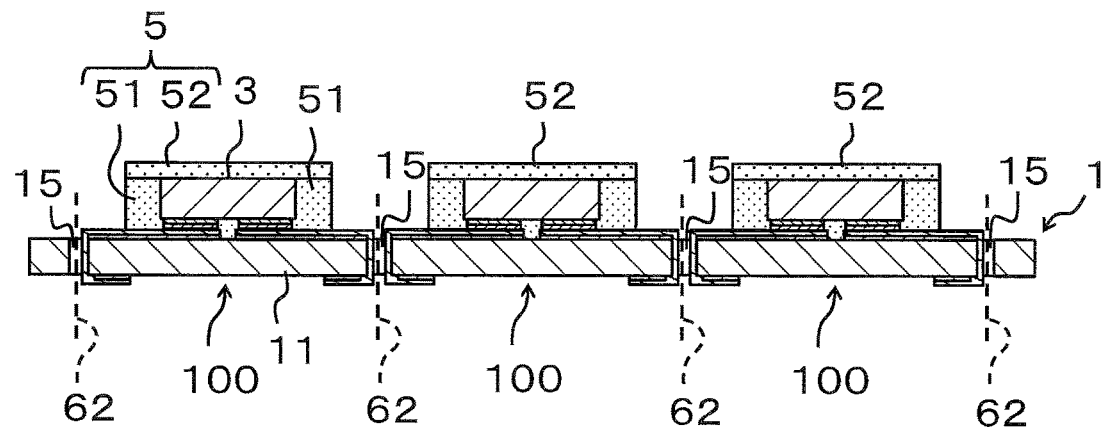
FIG. 11B is a cross-sectional view taken along line XIB-XIB in FIG. 11A showing the light-transmissive member forming step in the method for manufacturing the light emitting devices according to the second embodiment.

Next, a description is given of a light emitting device according to a second embodiment and a method for manufacturing the light emitting device, with reference to FIGS. 8 to 11B. FIG. 8 is a flowchart of a method for manufacturing light emitting devices according to the second embodiment. FIG. 9A is a plan view showing a light emitting element mounting step in the method for manufacturing the light emitting devices according to the second embodiment. FIG. 9B is a cross-sectional view taken along line IXB-IXB in FIG. 9A showing the light emitting element mounting step in the method for manufacturing the light emitting devices according to the second embodiment. FIG. 10A is a plan view showing a light shielding member forming step in the method for manufacturing the light emitting devices according to the second embodiment. FIG. 10B is a cross-sectional view taken along line XB-XB in FIG. 10A showing the light shielding member forming step in the method for manufacturing the light emitting devices according to the second embodiment. FIG. 11A is a plan view showing a light-transmissive member forming step in the method for manufacturing the light emitting devices according to the second embodiment. FIG. 11B is a cross-sectional view taken along line XIB-XIB in FIG. 11A showing the light-transmissive member forming step in the method for manufacturing the light emitting devices according to the second embodiment.

Configuration of Light Emitting Device

Light emitting devices 100 according to the second embodiment are configured by using a printed board 1 according to the first embodiment and mounting light emitting elements 3 on the printed board 1. Each of the light emitting devices 100 is sealed by a sealing member 5 made up of a light shielding member 51 covering side surfaces of one light emitting element 3 and a light-transmissive member 52 covering an upper surface of the one light emitting element 3.

Below, details of the light emitting devices 100 are described together with the manufacturing method thereof.

Method for Manufacturing Light Emitting Devices

A method for manufacturing the light emitting devices according to the second embodiment includes a printed board preparation step S21, a light emitting element mounting step S22, a sealing step S23, and a singulation step S24. The sealing step S23 includes a light shielding member forming step S231, and a light-transmissive member forming step S232.

The printed board preparation step S21 prepares a printed board 1 in accordance with the printed board manufacturing method according to the first embodiment or a variant embodiment thereof.

In the printed board 1 prepared in the present embodiment, before the openings 15 are formed by laser machining, portions of the first metal layer 12 and/or the second metal layer 13 located in the laser beam irradiation areas 21 have been removed by etching. Thus, even when the first metal layer 12 and the second metal layer 13 are configured to have a large thickness, it is possible to suppress an increase in the time period required for laser machining. The use of the first metal layer 12 and the second metal layer 13 having a large thickness reduces thermal resistance of wiring patterns. Thus, the wiring patterns efficiently release the heat from light emitting elements 3 mounted on the wiring patters, thus suppress an increase in the temperature of the light emitting elements 3. As a result, the emission efficiency of each of the light emitting elements 3 is increased and the luminous flux of the light emitting device 100 is improved.

The light emitting element mounting step S22 mounts the light emitting elements 3 on the printed board 1, which is a mounting board for mounting light emitting devices 100. The light emitting elements 3 may be semiconductor light emitting elements such as, but not limited to, light emitting diodes (LEDs) using nitride semiconductors, for example. In the present embodiment, each of the light emitting elements 3 has one surface on which a pair of n-side electrode 31 and p-side electrode 32. The n-side electrode 31 and p-side electrode 32 are respectively bonded to element mounting parts 16a and 17a located in a light emitting element area of the printed board 1, using a conductive bonding member 4 such as a solder or anisotropic conductive adhesive.

The type of the mounting of the light emitting elements 3 is not particularly limited. Like the present embodiment, light emitting elements 3 may be flip-chip mounted. Alternatively, the light emitting elements 3 may each be mounted in a face-up configuration using a die bonding resin and connected via conductive wires to the wiring electrodes 16, 17.

The sealing step S23 seals light emitting elements 3 with sealing members 5. As described above, the sealing step S23 includes the light shielding member forming step S231 and the light-transmissive member forming step S232.

The light shielding member forming step S231 forms light shielding members 51 such that each of the light shielding members 51 covers side surfaces of a partial set of the light emitting elements 3. The light shielding members 51 may each be a light reflecting member made of a light reflecting material or a light absorbing member made of a light absorbing material. The use of light reflecting members as the light shielding members 51 efficiently causes light emitted from each of the light emitting elements 3 to go out from the upper surface of the corresponding light emitting device 100, resulting in an increase in the light extraction efficiency. The use of light absorbing members as the light shielding members 51 enhances brightness contrast between light emitting surfaces and non-light emitting surfaces of the light emitting devices 100.

Examples of the light reflecting material include a white resin made by causing a light-transmissive resin, such as a silicone resin or an epoxy resin, to contain a white pigment, such as TiO2. Examples of the light absorbing material include a black resin made by causing the same light-transmissive resin to contain a black pigment, such as carbon black.

The light shielding members 51 can be formed by molding such a material or by application of such a material using screen printing or the like.

The light-transmissive member forming step S232 forms the light-transmissive members 52 such that each of the light-transmissive members 52 covers upper surfaces of a partial set of the light emitting elements 3 and the light shielding member 51 covering side surfaces of the partial set of the light emitting elements 3. Each of the light emitting elements 3 mounted on the printed board 1 is sealed by a sealing member 5 made up of one of the light shielding members 51 covering the side surfaces of the light emitting element 3 and one of the light-transmissive members 52 covering the upper surface of the light emitting element 3.

The material for the light-transmissive members 52 may be the same light-transmissive resin used for the light shielding members 51. In addition, the light-transmissive members 52 may contain phosphor particles that partially or entirely absorb light emitted from the light emitting elements 3 and emit light of a wavelength different from the wavelength of the light emitted from the light emitting elements 3.

The light-transmissive members 52 can be formed by a molding method or an application method. Alternatively, light-transmissive members 52 each having a plate-like shape may each be affixed to upper surfaces of a partial set of the light emitting elements 3 and an upper surface of the light shielding member 51 covering side surfaces of the partial set of the light emitting elements 3.

In the present embodiment, sealing members 5 are each made up of a pair of light shielding member 51 and light-transmissive member 52. However, the configuration and manufacturing method of the sealing members 5 are not limited thereto. For example, the sealing members 5 may each be formed by providing the material used for the light-transmissive members 52 such as to cover all the surfaces of a partial set of the light emitting elements 3 by a potting method or the like.

As another example, the sealing members 5 may be omitted and members that partially cover the light emitting elements 3 may be disposed in place of the sealing members 5.

The singulation step S24 singulates the printed board 1, which is a collective board, into light emitting devices 100, by dividing the printed board 1 per light emitting element area.

In the present embodiment, singulation of the light emitting devices 100 may be performed by cutting the printed board 1 and sealing members 5 along the boundary lines 61 by a dicing method or the like. In the printed board 1, two light emitting element areas adjacent in the length direction of the printed board 1 are already separated by one of the openings 15 formed along the boundary lines 62. Thus, cutting operations along the boundary lines 62 are not necessary.

The above performed steps manufacture the light emitting devices 100 according to the second embodiment.

Above, the printed board, the light emitting devices, and the method of manufacturing these according to the present invention have been specifically described based on certain embodiments for carrying out the present invention. However, the scope of the present invention is not limited to the above description, and is rather to be broadly interpreted based on the recitations in claims. In addition, it goes without saying that various modifications and variations made based on the above description are also included in the scope of the present invention.

The light emitting devices according to the embodiments of the present disclosure are applicable to lighting devices, automotive light emitting devices, and the like.

What is claimed is:

1. A method for manufacturing a printed board, the method comprising steps of:
providing a starting board comprising a base member having a plate-like shape, having an upper surface and a lower surface opposite the upper surface, and having an insulation property, a first metal layer disposed on the upper surface, and a second metal layer disposed on the lower surface; and
laser machining a through-hole penetrating the starting board in a thickness direction of the starting board by irradiating a laser beam irradiation area of the starting board with a laser beam from a side of the starting board on which side the first metal layer is disposed to form the printed board,
wherein the method further comprises a step of etching the second metal layer so as to remove a second metal layer removal portion of the second metal layer located in the laser beam irradiation area, prior to the step of laser machining,
wherein, in the step of laser machining, an annular through-groove is formed by irradiating the starting board with the laser beam by moving the laser beam during irradiation of the laser beam to scan along an outer edge of a through-hole formation area where the through-hole is to be formed, and then the through-hole is formed by removing a portion of the starting board separated from a remainder of the starting board by the formation of the annular through-groove, wherein the lower surface of the base member includes a portion that is an outermost surface of the printed board, and wherein the second metal layer is in direct contact with the lower surface adjacent to the portion that is the outermost surface and is spaced apart from the through-hole by at least a predetermined distance in a bottom view.

2. The method according to claim 1, wherein, in the step of etching, the second metal layer removal portion of the second metal layer is removed such that the second metal layer from which the second metal layer removal portion has been removed is spaced apart from the laser beam irradiation area by at least the predetermined distance.

3. The method according to claim 1, wherein the step of etching further etches the first metal layer so as to remove a first metal layer removal portion of the first metal layer located in the laser beam irradiation area.

4. The method according to claim 3, wherein, in the step of etching, the first metal layer removal portion of the first metal layer is removed such that the first metal layer from which the first metal layer removal portion has been removed is spaced apart from the laser beam irradiation area by at least the predetermined distance.

5. The method according to claim 1, wherein materials constituting the base member comprises one or more resin materials selected from the group consisting of epoxy resins, polyimide resins, polyethylene terephthalate resins, polyethylene naphthalate resins, bismaleimide triazine resins, phenolic resins, silicone resins, modified silicone resins, and epoxy-modified silicone resins.

6. The method according to claim 5, wherein the base member contains one or more reinforcement materials selected from the group consisting of glass fibers, ceramics fibers, carbon fibers, and aramid fibers.

7. The method according to claim 1, wherein each of the first metal layer and the second metal layer is made of one or more metal materials selected from the group consisting of Cu, Ag, Au, Ni, and Al, or made of an alloy containing the one or more metal materials as a major component.

8. The method according to claim 1, wherein the first metal layer has a thickness of at least 1 μm and at most 18 μm.

9. The method according to claim 1, wherein the base member has a thickness of at least 200 μm and at most 500 μm.

10. The method according to claim 1, wherein, in the step of laser machining:
an oscillation wavelength of the laser beam is at least 250 nm and at most 2000 nm;
a power of the laser beam is at least 10 W and at most 60 W;
the laser beam is a pulsed laser beam having a pulse frequency of at least 100 kHz and at most 3000 KHz, a pulse width of at least 10 picoseconds and at most 100 nanoseconds, and a pulse energy of at least 3 μJ;
the laser beam has a fluence of at least 3 J/cm$^2$ at an upper surface of the starting board, and has a fluence of at least 10 J/cm$^2$ at a focal point of the laser beam;
when cyclically irradiating the printing board at a same location in a plan view, a time interval between irradiation cycles is at least 5 msec; and
a scanning speed of the laser beam is at least 1000 mm/s and at most 3000 mm/s.

11. The method according to claim 1, wherein, in the step of laser machining, the laser beam has a diameter of at least 10 μm and at most 30 μm.

12. The method according to claim 1, the method further comprising a step of plating a third metal layer that continuously covers the first metal layer, the second metal layer, and an inner surface of the through-hole, after the step of laser machining.

13. The method according to claim 12, the method further comprising a step of forming a wiring pattern by etching the first metal layer, the second metal layer, and the third metal layer, after the step of plating.

14. A method for manufacturing a light emitting device, the method comprising steps of:
providing the printed board by the method according to claim 13; and
mounting a light emitting element on the printed board such that the light emitting element is electrically connected with the wiring pattern.

15. The method according to claim 8, wherein the second metal layer has a thickness of at least 1 μm and at most 18 μm.

16. The method according to claim 14, the method further comprising a step of forming a light shielding member such that the upper surface of the light emitting element is exposed from the light shielding member and the side surface of the light emitting element is covered with the light shielding member.

17. The method according to claim 16, wherein the light shielding member is a light reflecting member.

18. The method according to claim 17, wherein the light reflecting member contains $TiO_2$.

19. The method according to claim 16, wherein the light shielding member is a light absorbing member.

20. The method according to claim 19, wherein the light absorbing member contains a black pigment.

21. The method according to claim 16, the method further comprising a step of forming a light-transmissive member such the light-transmissive member covers the upper surface of the light emitting element and the upper surface of the light shielding member.

22. The method according to claim 21, wherein the light-transmissive member contains phosphor particles.

23. The method according to claim 1, wherein, in the step of laser machining, the annular through-groove is formed by irradiating the starting board with the laser beam by moving the laser beam during irradiation of the laser beam to scan around an entirety of the outer edge of the through-hole formation area a plurality of times.

24. The method according to claim 1, wherein, in the step of laser machining, the annular through-groove is formed by irradiating the starting board with the laser beam by moving the laser beam during irradiation of the laser beam to continuously scan around an entire outer perimeter of the through-hole formation area to form the annular through-hole groove.

25. The method according to claim 1,
wherein the base member is a laminate,
wherein an entirety of the laminate constituting the base member has an outermost upper surface and an outermost lower surface,
wherein the first metal layer is in direct contact with the outermost upper surface, and
wherein the second metal layer is in direct contact with the outermost lower surface.

26. The method according to claim 2,
wherein, in the step of etching, the second metal layer removal portion of the second metal layer is removed such that the second metal layer is spaced apart from the through-hole by at least the predetermined distance in a bottom view such that an end of the lower surface of the base member is exposed from the second metal layer,
further comprising a step of plating a third metal layer that continuously covers the first metal layer, the second metal layer, and an inner surface of the through-hole, after the step of laser machining, and
wherein the third metal layer covers the end of the lower surface of the base member that is exposed from the second metal layer.

* * * * *